United States Patent [19]

Tiffin

[11] Patent Number: 4,720,322
[45] Date of Patent: Jan. 19, 1988

[54] PLASMA ETCHING OF BLIND VIAS IN PRINTED WIRING BOARD DIELECTRIC

[75] Inventor: Paula K. Tiffin, Garland, Tex.

[73] Assignee: Texas Instruments Incorporated, Dallas, Tex.

[21] Appl. No.: 37,761

[22] Filed: Apr. 13, 1987

[51] Int. Cl.$^4$ .............. B44C 1/22; C03C 15/00; C23F 1/02; B29C 37/00

[52] U.S. Cl. .................. 156/643; 29/852; 156/644; 156/646; 156/652; 156/656; 156/659.1; 156/668; 156/902; 156/345; 204/192.36; 252/79.1; 427/97

[58] Field of Search .............. 156/643, 644, 646, 652, 156/655, 656, 902, 659.1, 668, 345; 204/192.35, 192.36; 427/38, 39, 97; 29/852; 174/68.5; 252/79.1

[56] References Cited

U.S. PATENT DOCUMENTS

| | | | |
|---|---|---|---|
| 4,496,420 | 1/1985 | Frohlich et al. | 156/643 |
| 4,517,050 | 5/1985 | Johnson et al. | 156/643 |
| 4,567,062 | 10/1984 | Fan | 427/96 |
| 4,572,764 | 12/1984 | Fan | 156/630 |
| 4,642,160 | 2/1987 | Burgess | 156/652 X |
| 4,676,865 | 6/1987 | DeLarge | 156/643 |

Primary Examiner—William A. Powell
Attorney, Agent, or Firm—Richard K. Robinson; James T. Comfort; Melvin Sharp

[57] ABSTRACT

A method of plasma etching blind vias in printed wiring board dielectric which comprises the steps of providing a printed wiring board of organic material having a buried electrically conductive pattern in the organic material and an electrically conductive layer on the surface of the board, removing predetermined portions of the electrically conductive layer to expose the organic material thereunder and define at least one via location thereat, providing a plasma etching chamber having one or more pairs of spaced parallel electrodes, positioning the board between the said electrodes, electrically connecting the board to one of said electrodes and having the surface facing and parellel to the electrodes, filling the chamber with a mixture of an oxidizing gas and a fluorocarbon gas, etching the organic material from the exposed organic material at the surface to the buried pattern to expose the buried pattern by applying an RF signal across the electrodes, and forming an electrically conductive layer of the exposed surfaces of the organic material contacting the exposed buried pattern and the conductive layer.

20 Claims, 5 Drawing Figures

PLASMA ETCHING OF BLIND VIAS IN PRINTED WIRING BOARD DIELECTRIC

BACKGROUND OF THE INVENTION

1. Field of the Invention

This invention relates plasma etching of vias between two conductor levels in a printed wiring board (PWB) wherein the conductor levels are separated by organic dielectric material.

2. Brief Description of the Prior Art

Vias which are formed in printed wiring boards are used as an electrical or thermal interconnect between two sequential layers. Generation of a blind via begins with formation of a layer of dielectric material and a layer of copper onto the board which already has a copper layer on the surface thereof. The top or exposed layer of copper is then coated with resist, imaged and etched to remove the copper where blind vias are desired. To form the connection between the sequential copper layers, the dielectric material is removed from under the etched copper opening using a known method. The board is then coated with a thin layer of copper on the surface and in the vias to make the electrical or thermal connection to the copper layer on the board.

The formation of the blind via in the dielectric material is generally accomplished by discrete laser drilling, this being possible on one or two boards at a time. Although this method produces high quality vias, it is extremely time consuming. Also, the required equipment is quite expensive and bulky. Due to the limited number of boards that can be operated upon by one piece of equipment, the amount of equipment required for processing large number of boards becomes substantial, providing a great economic as well as space burden. It is therefore apparent that a method and system for formation of such blind vias which is capable of doing so on many boards simultaneously and at lower cost is essential to provide the desired economic as well as space advantage.

SUMMARY OF THE INVENTION

In accordance with the present invention, there is provided a method and system for etching blind vias in printed wiring boards which minimizes the problems inherent in the prior art.

Briefly, blind vias are formed by providing a printed wiring board of an organic material, preferably an epoxy with Kevlar strands or epoxy with Nomex strands. The ratio range of Kevlar to epoxy is from about 30% to about 50% by volume of Kevlar and the ratio range of Nomex to epoxy is from about 20% to about 50% by volume of Nomex. The specific classes of epoxy used are FR4, FR5, tetrafunctional. Kevlar and Nomex are produced by E.I. duPont deNemours and Company and are both aramid fibers. The board has an electrically conductive pattern thereon, preferably copper, though other materials can be used for the pattern such as nickel, gold, tin/lead mixtures and the like, in a first layer, with an electrically insulating layer thereover, preferably the same material as the board. A further electrically conductive layer, preferably copper is formed over the insulating layer. This further conductive layer is patterned with photoresist and etched to remove the copper in the patterned areas where the vias are to be formed to expose the dielectric at the etched regions.

The board is then positioned in a plasma etching chamber, the chamber having one or more pairs of parallel plate electrodes, this electrode arrangement being critical to proper etching of the materials involved. The surface of the board which is to be etched is positioned parallel to the parallel plate electrodes and in contact with one of the electrodes. The chamber is then evacuated to a non-critical low pressure of about 0 to 100 mTorr and a gas containing from about 50% to about 90% of oxygen and the rest fluorocarbon gas such as $CF_3Cl$, $CF_3Br$, $CHF_3$, $SF_6$, $C_2F_6$ and, preferably, $CF_4$ is then flowed into the chamber. A preferred ratio is 3 parts fluorocarbon to 7 parts oxidizing gas, the flow rate being dependent upon the volume of the chamber. The effluent is removed by a vacuum pump, the effluent, of necessity, being gaseous. It is preferred that the board and the atmosphere within the chamber be in the range of from about 25 to about 150 degrees C. during the entire reaction. The higher temperatures have been found to provide a higher etch rate and improve the final geometry of the etched via. However, too high a temperature will cause peeling of the conductive layer from the insulating layer. A trade-off is therefore required. Peeling temperatures are dependent upon the compositions involved. The preferred temperature range is 120 to 130 degrees C. Because there is a tendency for the temperature in the chamber to increase during etching, it is necessary to continually monitor the temperature and cool the chamber by feeding cooled gas or liquid thereto through a cooling mechanism in the chamber which is controlled in view of the temperature reading within the chamber in standard manner. Temperatures far in excess of about 150 degrees C. can cause the board and conductor thereon to peel apart, this temperature being determined by the particular materials involved.

Etching takes place by applying RF power between the plates of from about 40 kilohertz to about 13.56 megahertz with about 100 kilohertz being preferred at from about 0.5 to about 3.0 watts per square inch of energized electrode area with about 2.5 watts per square inch being preferred. The above described system operating in the parameter ranges above stated is now permitted to etch away the dielectric until the underlayer of copper has been exposed. This is determined in known manner, such as by analyzing the etching chamber effluent for a particular change therein or by using the copper layer as an etch stop.

The board is then removed from the chamber, cleaned and plated in standard manner with a metal, such as copper, for electrical and/or thermal connection to the underlayer. The plating layer covers all exposed areas of the board including the dielectric walls of the formed vias and the exposed underlayer as well as the conductive layer on the upper surface of the dielectric to produce the completed board with surface connection to the underlayer.

DESCRIPTION OF THE PREFERRED EMBODIMENT

Referring now to FIGS. 1 to 4, there is shown a set of schematic diagrams depicting the processing steps required for formation of vias in accordance with the present invention.

Figure 1:
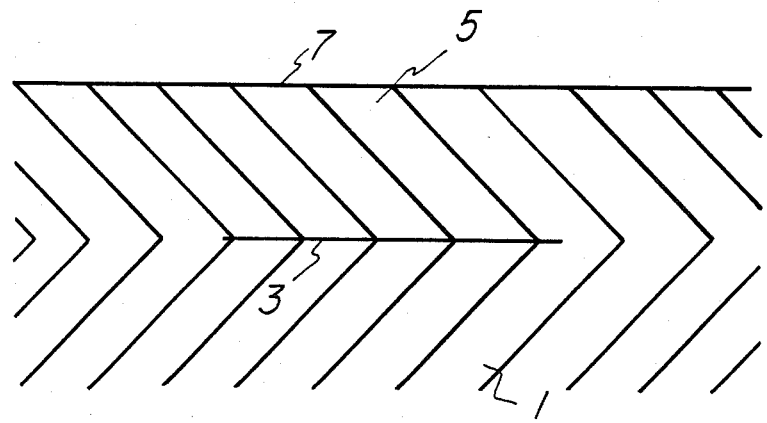
FIG. 1 is a sectional view of a printed wiring board having a first conductor thereon with an insulator and surface conductor thereover.

Initially, a printed wiring board 1 is provided, which is formed of an electrically insulating material, preferably an epoxy with strands therein of Kevlar or Nomex, aramid compositions produced by the duPont Corporation. An electrically conductive pattern 3, preferably of copper, is formed on the surface of the epoxy/Kevlar or epoxy/Nomex 1. A second electrically insulating layer 5, preferably of an epoxy aramid composition as in the wiring board 1, is then deposited over the board 1 as well as over the conductive pattern 3 to bury the layer 3 and a layer of electrically conductive material 7, preferably copper, is formed over the insulating layer 5. The structure at this point in the procedure is shown in FIG. 1.

Figure 2:
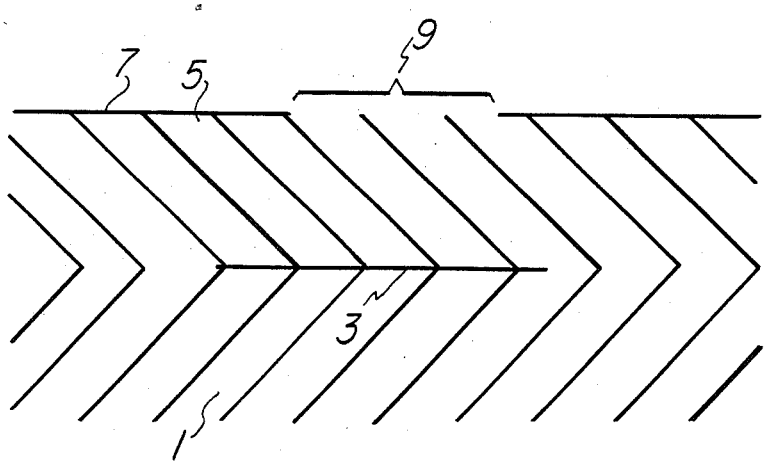
FIG. 2 is a view as in FIG. 1 with a portion of the surface conductor removed.

A patterned photoresist is then deposited over the copper layer 7, leaving exposed copper in those regions whereat vias are to be formed. The exposed copper is then etched in standard manner, leaving the copper-free region 9 as shown in FIG. 2. This region, in the preferred embodiment, was about $3 \times 10^{-5}$ square inches for one via or about 0.9 square inches for one side of one board. The portion of the insulating layer 5 beneath the exposed region 9 is then etched, using a plasma etching process which will now be described, resulting in the structure shown in FIG. 3 wherein the layer 5 is etched away down to the copper layer 3, exposing said layer 3.

Figure 5:
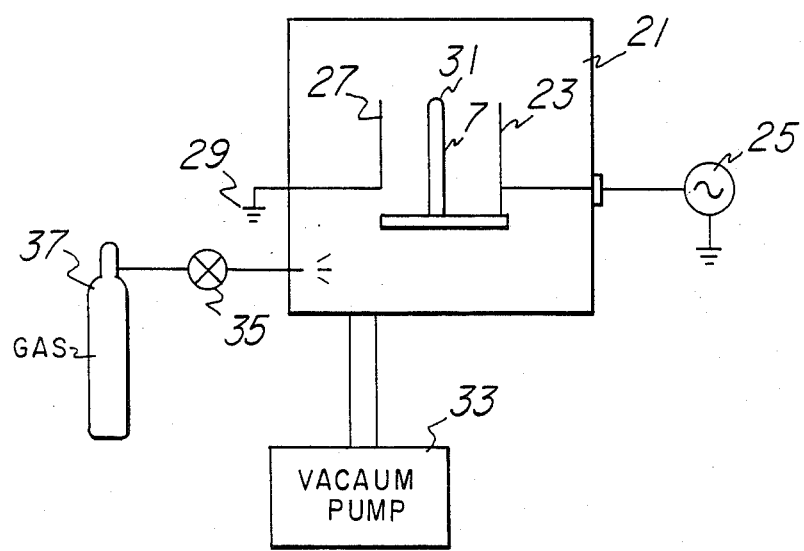
FIG. 5 is a schematic drawing of a plasma etching chamber with boards to be etched therein in accordance with the requirements of the present invention.

The etching process takes place in a plasma etching chamber 21, of the type shown in FIG. 5. The chamber includes one or more pairs of parallel plates, the first plate 23 being coupled to an RF generator 25 and the second plate 27 being coupled to a reference source 29, such as ground potential. The structure 31 as shown in FIG. 2 is placed between the plates 23 and 27 so that the layer 7 is parallel to the plate 23 and connected to one of the plates 23 and 27. Structure 31 may rest upon plate 23 or 27 in a horizontal design. Connection to the plate 23 is shown in FIG. 5. The chamber is then evacuated by operation of the vacuum pump 33 which is coupled to the chamber 21, the chamber is heated to a temperature of 120 degrees C. and the valve 35 is then opened to permit gas from the gas source 37 to enter the chamber 21. The gas is a mixture of oxygen and carbon tetrafluoride in the ratio of 3 parts carbon tetrafluoride to 7 parts oxygen. The gas source 37 is depicted as a single source. However, it should be understood that plural individual gas sources can be used with mixture thereof taking place either external to or within the chamber 21. Mixing external to the chamber is performed in order to provide better gas homogeneity within the chamber. As stated hereinabove, gas mixtures can include various combinations of an oxidizer and a fluorocarbon. A cooling mechanism is placed in the chamber to maintain the temperature therein constant.

Figure 3:
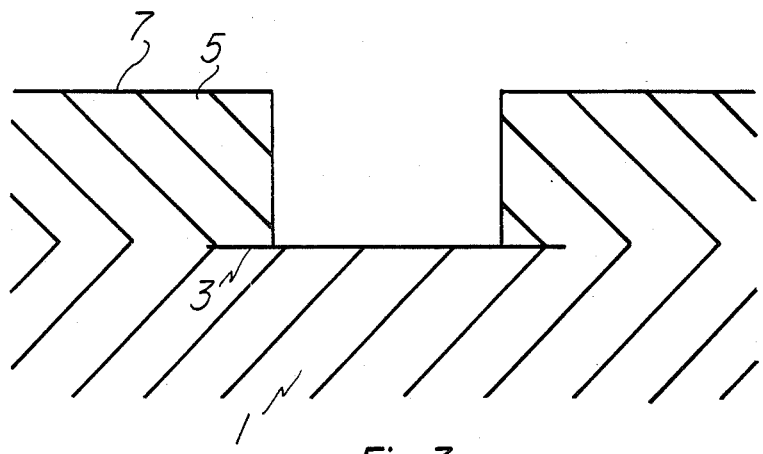
FIG. 3 is a view as in FIG. 2 with the insulator beneath the etched region removed down to the first conductor.

In operation, after the chamber 21 has been evacuated, the temperature therein adjusted and the valve 35 opened, the gas mixture enters the chamber. At the same time, the RF generator 25 is set to operate at 100 kilohertz with a power output of 2.5 watts per square inch of energized electrode area. In the preferred embodiment, the electrode had a 20 inch diameter and the power was set at 800 watts. The RF generator was turned on to form a plasma in the chamber, the plasma providing an anisotropic etching of the exposed portion of the layer 5 beneath the region 9 until the etch stop in the form of the copper layer 3 was reached, whereupon etching ceased. This procedure took about 4 hours. The result is shown in FIG. 3. The RF generator was turned off. The valve 35 was then closed and the structure 31 was then removed from the chamber 21.

Figure 4:
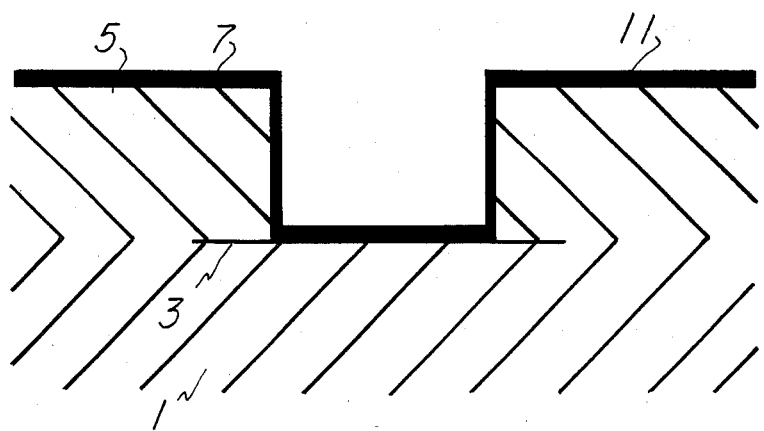
FIG. 4 is a view as in FIG. 3 with the exposed surfaces of the board including the exposed insulator walls coated with a conductor.

As can be seen with reference to FIG. 3, a via has been formed through the dielectric layer 5 which exposes the copper layer 3, the latter having acted as an etch stop as well. The etched structure as shown in FIG. 3 was then cleaned with a high pressure powder blast to remove any carbonized material residue with a subsequent water rinse to remove the powder. The structure of FIG. 3 was then coated with a conductor 11 which is preferably conformal to the upper surface thereof as shown in FIG. 4. This layer was formed of copper and deposited by standard plating techniques. These included standard cleaning of the surface to be plated followed by electroless copper deposition on the entire surface of the board and via with subsequent electrolytic plating to the desired thickness in the via. While the formation of the via has been shown with reference to a single location on a single printed wiring board, it should be understood that single or plural boards, each with one or more via locations, can be placed into the chamber 21 simultaneously to form plural vias during a single batch operation.

Though the invention has been described with respect to a specific preferred embodiment thereof, many variations and modifications will be immediately apparent to those skilled in the art. It is therefore the intention that the appended claims be interpreted as broadly as possible in view of the prior art to include all such variations and modifications.

I claim:

1. A method of forming blind vias in an organic printed wiring board, comprising the steps of:
   (a) providing a printed wiring board of organic material having a buried electrically conductive pattern in said organic material and an electrically conductive layer on the surface of said board;
   (b) removing predetermined portions of said electrically conductive layer to expose said organic material thereunder and define at least one via location thereat;
   (c) providing a plasma etching chamber having at least one pair of spaced parallel electrodes;
   (d) positioning said board between said electrodes, electrically connecting said board to one of said electrodes and having said surface facing and parallel to the said electrodes;
   (e) filling said chamber with a mixture of an oxidizing gas and a fluorocarbon gas;
   (f) etching said organic material from said exposed organic material at said surface to said buried pattern to expose said buried pattern by applying an RF signal across said electrodes; and (g) forming an electrically conductive layer on the exposed surfaces of said organic material contacting said exposed buried pattern and said conductive layer.

2. A method as set forth in claim 1 wherein said organic material is taken from the class consisting of an epoxy resin filled with a material taken from the class consisting of aramid fibers.

3. A method as set forth in claim 1 wherein said layer and said pattern are each formed of copper.

4. A method as set forth in claim 2 wherein said layer and said pattern are each formed of copper.

5. A method as set forth in claim 1 further including the step of heating said board prior to step (f) to a temperature of from about 120 degrees C. to about 130 degrees C.

6. A method as set forth in claim 2 further including the step of heating said board prior to step (f) to a temperature of from about 120 degrees C. to about 130 degrees C.

7. A method as set forth in claim 3 further including the step of heating said board prior to step (f) to a temperature of from about 120 degrees C. to about 130 degrees C.

8. A method as set forth in claim 4 further including the step of heating said board prior to step (f) to a temperature of from about 120 degrees C. to about 130 degrees C.

9. A method as set forth in claim 1 wherein said oxidizing gas is oxygen and said fluorocarbon is carbon tetrafluoride.

10. A method as set forth in claim 2 wherein said oxidizing gas is oxygen and said fluorocarbon is carbon tetrafluoride.

11. A method as set forth in claim 7 wherein said oxidizing gas is oxygen and said fluorocarbon is carbon tetrafluoride.

12. A method as set forth in claim 8 wherein said oxidizing gas is oxygen and said fluorocarbon is carbon tetrafluoride.

13. A method as set forth in claim 9 wherein the ratio of said oxidizing gas to said fluocarbon is about 7 to 3.

14. A method as set forth in claim 10 wherein the ratio of said oxidizing gas to said fluorocarbon is about 7 to 3.

15. A method as set forth in claim 11 wherein the ratio of said oxidizing gas to said fluocarbon is about 7 to 3.

16. A method as set forth in claim 12 wherein the ratio of said oxidizing gas to said fluorocarbon is about 7 to 3.

17. A method as set forth in claim 1 wherein said RF signal is from about 40 kilohertz to about 13.56 megahertz at a power of about 2.5 watts per square inch of energized area of one of said electrodes.

18. A method as set forth in claim 2 wherein said RF signal is from about 40 kilohertz to about 13.56 megahertz at a power of about 2.5 watts per square inch of energized area of one of said electrodes.

19. A method as set forth in claim 15 wherein said RF signal is from about 40 kilohertz to about 13.56 megahertz at a power of about 2.5 watts per square inch of energized area of one of said electrodes.

20. A method as set forth in claim 16 wherein said RF signal is from about 40 kilohertz to about 13.56 megahertz at a power of about 2.5 watts per square inch of energized area of one of said electrodes.

* * * * *